(12) United States Patent
Cheng et al.

(10) Patent No.: US 12,072,359 B2
(45) Date of Patent: Aug. 27, 2024

(54) POWER DISTRIBUTION TERMINAL HAVING DISPLAY MODULE, AND WIRELESS POWER DISTRIBUTION DISPLAY SYSTEM AND METHOD

(71) Applicant: SCHNEIDER ELECTRIC INDUSTRIES SAS, Rueil-Malmaison (FR)

(72) Inventors: Ying Cheng, Shanghai (CN); Chenglong Sun, Shanghai (CN); Jiamin Chen, Shanghai (CN); Xiaolong Zhu, Shanghai (CN); Yun Fang, Shanghai (CN); Simon Tian, Rueil-Malmaison (FR)

(73) Assignee: Schneider Electric Industries SAS, Rueil-Malmaison (FR)

( * ) Notice: Subject to any disclaimer, the term of this patent is extended or adjusted under 35 U.S.C. 154(b) by 255 days.

(21) Appl. No.: 17/777,174

(22) PCT Filed: Nov. 18, 2020

(86) PCT No.: PCT/CN2020/129704
§ 371 (c)(1),
(2) Date: May 16, 2022

(87) PCT Pub. No.: WO2021/098714
PCT Pub. Date: May 27, 2021

(65) Prior Publication Data
US 2022/0390494 A1  Dec. 8, 2022

(30) Foreign Application Priority Data

Nov. 18, 2019  (CN) .......................... 201911126686.8

(51) Int. Cl.
*G06F 11/30* (2006.01)
*G01R 22/06* (2006.01)
(Continued)

(52) U.S. Cl.
CPC .......... *G01R 22/063* (2013.01); *G01R 22/10* (2013.01); *H02J 13/00026* (2020.01)

(58) Field of Classification Search
CPC .................................................... G01R 22/063
See application file for complete search history.

(56) References Cited

U.S. PATENT DOCUMENTS

2005/0065743 A1  3/2005  Cumming et al.
2011/0062780 A1  3/2011  Verges et al.
(Continued)

FOREIGN PATENT DOCUMENTS

CN       104166384 A      11/2014
CN       104426243    *    3/2015
(Continued)

OTHER PUBLICATIONS

International Search Report and Written Opinion mailed Feb. 19, 2021 for International Patent Application No. PCT/CN2020/129704, 6 pages.

(Continued)

*Primary Examiner* — Phuong Huynh
(74) *Attorney, Agent, or Firm* — Locke Lord LLP (57) ABSTRACT

A power distribution terminal provided with a display module, a wireless power distribution display system and a wireless power distribution display method are disclosed. The wireless power distribution display system includes a local gateway, and at least two power distribution terminals which are communicated with the local gateway in a short-distance wireless communication mode and send their terminal identification data to the local gateway; at least one of the at least two power distribution terminals is provided with a display module; the local gateway outputs the terminal identification data in a short-distance wireless communication mode; and the at least one power distribution terminal (Continued)

provided with a display module receives the terminal identification data of other distribution terminals from the local gateway in a short-distance wireless communication mode, and displays the terminal identification data.

11 Claims, 7 Drawing Sheets

(51) Int. Cl.
*G01R 22/10* (2006.01)
*H02J 13/00* (2006.01)

(56) References Cited

U.S. PATENT DOCUMENTS

| | | |
|---|---|---|
| 2011/0196547 A1 | 8/2011 | Park et al. |
| 2019/0221395 A1 | 7/2019 | Hendrixson, III et al. |

FOREIGN PATENT DOCUMENTS

| | | |
|---|---|---|
| CN | 104426243 A | 3/2015 |
| CN | 105807130 A | 7/2016 |
| CN | 108462071 A | 8/2018 |
| CN | 108693395 A | 10/2018 |
| EP | 4044398 A1 | 8/2022 |
| WO | 2008140691 A1 | 11/2008 |
| WO | WO 2021098714 A1 | 5/2021 |

OTHER PUBLICATIONS

Extended European Search Report dated Oct. 16, 2023 for corresponding European Patent Application No. 1 20889016.0-1202, 10 pages.

* cited by examiner

POWER DISTRIBUTION TERMINAL HAVING DISPLAY MODULE, AND WIRELESS POWER DISTRIBUTION DISPLAY SYSTEM AND METHOD

The present application claims the priority of Chinese patent application No. 20191126686.8 filed on Nov. 18, 2019, and the contents disclosed in the above-mentioned Chinese patent application are hereby cited in its entirety as a part of the present application.

TECHNICAL FIELD

The present invention relates to the field of automation control and power distribution, and more particularly relates to a power distribution terminal provided with display module, a wireless power distribution display system and a wireless power distribution display method.

BACKGROUND

With the wide application of automation control in civil and commercial fields, power distribution control devices play an increasingly important role in building distribution boxes/cabinets and household distribution boxes. As a result, wireless power distribution systems and power distribution terminals are also confronted with striker requirements.

In the current wireless power distribution system, multiple power distribution terminals communicate with each other through wireless gateways. However, on the one hand, some wireless power distribution systems may not include display modules at both the wireless gateway side and the power distribution terminal side, and users can only obtain communication data through a central control room; and some other wireless power distribution systems may have display modules at the wireless gateway side, but their display modules can't be viewed by users in time because the wireless gateways are usually installed inside metal-made power distribution cabinets, which brings difficulties to on-site debugging and observing. On the other hand, there are some wireless power distribution systems that provide each power distribution terminals with a display module, which significantly increases the manufacturing cost of the wireless power distribution system, and results in poor utilization rate of the display module for each power distribution terminal.

Therefore, a wireless power distribution system with low cost and high reliability is needed, which is convenient for users to realize data checking and operation controlling of each power distribution terminal in real time, on the premise of achieving good power distribution function.

SUMMARY

In view of the above problems, the present invention provides a power distribution terminal provided with a display module, a wireless power distribution display system and a wireless power distribution display method. With the use of the wireless power distribution display system provided by the present invention, it can realize real-time display of communication data according to users' requirements, on the premise of achieving a power distribution function; furthermore, the method involves low cost and good robustness.

According to an aspect of the present invention, a wireless power distribution display system is provided, including: a local gateway; and at least two power distribution terminals, the at least two power distribution terminals are communicated with the local gateway in a short-distance wireless communication mode and send terminal identification data thereof to the local gateway; wherein at least one power distribution terminal of the at least two power distribution terminals is provided with a display module; and wherein the local gateway outputs the terminal identification data in the short-distance wireless communication mode, and the at least one power distribution terminal provided with the display module receives the terminal identification data of other power distribution terminals from the local gateway in the short-distance wireless communication mode and displays the terminal identification data.

The wireless power distribution display system according to the present invention may further include one or more of the following features, alone or in combination.

In some embodiments, the at least one power distribution terminal provided with the display module includes: a short-distance wireless communication module, which receives at least one selected from the group consisted of the terminal identification data, response information and response data of other power distribution terminals communicated with the local gateway from the local gateway in the short-distance wireless communication mode, and uses the same as data to be displayed; and the display module, which is connected with the short-distance wireless communication module, receives the data to be displayed from the short-distance wireless communication module and displays the data to be displayed.

In some embodiments, the at least one power distribution terminal provided with the display module receives a user's control command, generates command information based on the control command, and sends the command information to the local gateway in the short-distance wireless communication mode; wherein the command information includes the terminal identification data of a target power distribution terminal.

In some embodiments, the local gateway receives the command information from the at least one power distribution terminal provided with the display module, determines the target power distribution terminal based on the terminal identification data in the command information, and sends the command information to the target power distribution terminal in the short-distance wireless communication mode; and the target power distribution terminal receives the command information in the short-distance wireless communication mode, and generates corresponding response data based on the command information.

In some embodiments, the target power distribution terminal outputs the response data in the short-distance wireless communication mode; the local gateway receives the response data from the target power distribution terminal in the short-distance wireless communication mode, and outputs the response data in the short-distance wireless communication mode; and the at least one power distribution terminal provided with the display module receives the response data from the local gateway in the short-distance wireless communication mode and displays the response data.

According to another aspect of the present disclosure, a power distribution terminal provided with a display module is provided, including: a short-distance wireless communication module including a communication input end and a communication output end, the communication input end receives at least one selected from the group consisted of terminal identification data, response information and response data of other power distribution terminals communicated with the local gateway from the local gateway in a short-distance wireless communication mode, and uses the same as data to be displayed; and the display module, the display module is connected to the short-distance wireless communication module, receives the data to be displayed from the short-distance wireless communication module and displays the data to be displayed.

The power distribution terminal provided with the display module according to the present invention may further include one or more of the following features, alone or in combination.

In some embodiments, the display module receives a control command from a user and generates a command signal based on the control command; the short-distance wireless communication module receives the command signal from the display module and generates command information based on the command signal; and the communication output end of the short-distance wireless communication module sends the command information to the local gateway in the short-distance wireless communication mode; wherein the command information includes the terminal identification data of a target power distribution terminal.

In some embodiments, the communication input end of the short-distance wireless communication module receives the response data from the local gateway in the short-distance wireless communication mode; and the display module receives the response data from the short-distance wireless communication module and displays the response data.

According to yet another aspect of the present invention, a wireless power distribution display method is provided, including: communicating with a local gateway in a short-distance wireless communication mode, and sending terminal identification data thereof to the local gateway, by at least two power distribution terminals; and outputting the terminal identification data in the short-distance wireless communication mode, by the local gateway; wherein at least one power distribution terminal of the at least two power distribution terminals is provided with a display module; the at least one power distribution terminal provided with the display module receives the terminal identification data of other power distribution terminals from the local gateway in the short-distance wireless communication mode, and displays the terminal identification data.

In some embodiments, the wireless power distribution display method further includes: receiving at least one selected from the group consisted of terminal identification data, response information and response data of other power distribution terminals communicated with the local gateway from the local gateway in the short-distance wireless communication mode, using the same as data to be displayed, and displaying the data to be displayed, by the at least one power distribution terminal provided with the display module.

In some embodiments, the wireless power distribution display method further includes: receiving a user's control command, generating command information based on the control command, and sending the command information to the local gateway in the short-distance wireless communication mode, by the at least one power distribution terminal provided with the display module; wherein the command information includes the terminal identification data of a target power distribution terminal.

In some embodiments, the wireless power distribution display method further includes: receiving the command information from the at least one power distribution terminal provided with the display module, determining the target power distribution terminal based on the terminal identification data in the command information, and sending the command information to the target power distribution terminal in the short-distance wireless communication mode, by the local gateway; and receiving the command information in the short-distance wireless communication mode, and generating corresponding response data based on the command information, by the target power distribution terminal.

In some embodiments, the wireless power distribution display method further includes: outputting the response data in the short-distance wireless communication mode by the target power distribution terminal; receiving the response data from the target power distribution terminal in the short-distance wireless communication mode, and outputting the response data in the short-distance wireless communication mode, by the local gateway; and receiving the response data from the local gateway in the short-distance wireless communication mode and displaying the response date, by the at least one power distribution terminal provided with the display module.

With the use of the power distribution terminal provided with the display module, the wireless power distribution display system and the wireless power distribution display method provided by the present invention, it can well complete the power distribution function with lower cost and higher reliability, and can display, on a single power distribution terminal, the data of other power distribution terminals in the wireless power distribution display system, which is convenient for users to check the data of other power distribution terminals in the power distribution system in real time through the power distribution terminal.

BRIEF DESCRIPTION OF THE DRAWINGS

In order to more clearly illustrate the technical solutions of the embodiments of the present invention, the drawings of the embodiments will be briefly described in the following. It is obvious that the described drawings are only related to some embodiments of the present invention, based on which other drawings may be obtained by those ordinary skilled in the art without any inventive work. The drawings as below are not deliberately drawn to actual scales, and the emphasis is on the illustration of the concept of the present invention.

DETAILED DESCRIPTION

Hereinafter, the technical solutions of the embodiments of the present invention will be described in a clear and complete way in connection with the drawings. Apparently, the described embodiments are just a part but not all of the embodiments of the present invention. Based on the described embodiments of the present invention, those ordinary skilled in the art can obtain other embodiment(s), without any inventive work, which should be within the scope of the present invention.

As indicated in the present application and the claims, unless otherwise defined in the context, the words "a/an", "one", "one type" and/or "the" etc., are not intended to specifically indicate a singular form but may also include a plural form. Generally speaking, the terms "comprise/comprising" and "include/including" only imply the inclusion of clearly identified steps and elements, but these steps and elements do not constitute an exclusive list, and methods or devices may also contain other steps or elements.

Although the present application makes various references to some modules in the system according to the embodiments of the present application, any number of different modules may be used and executed on a user terminal and/or server. These modules are only illustrative, and different modules may be used for different aspects of the claimed system and method.

A flowchart is used in the present application to explain the operations performed by the system according to the embodiments of the present application. It should be understood that the preceding or following operations are not necessarily performed exactly in order. On the contrary, various steps may be processed in a reverse order or simultaneously, as required. Also, it can add other operations to these procedures, or remove one or more operations from these procedures.

Figure 1:
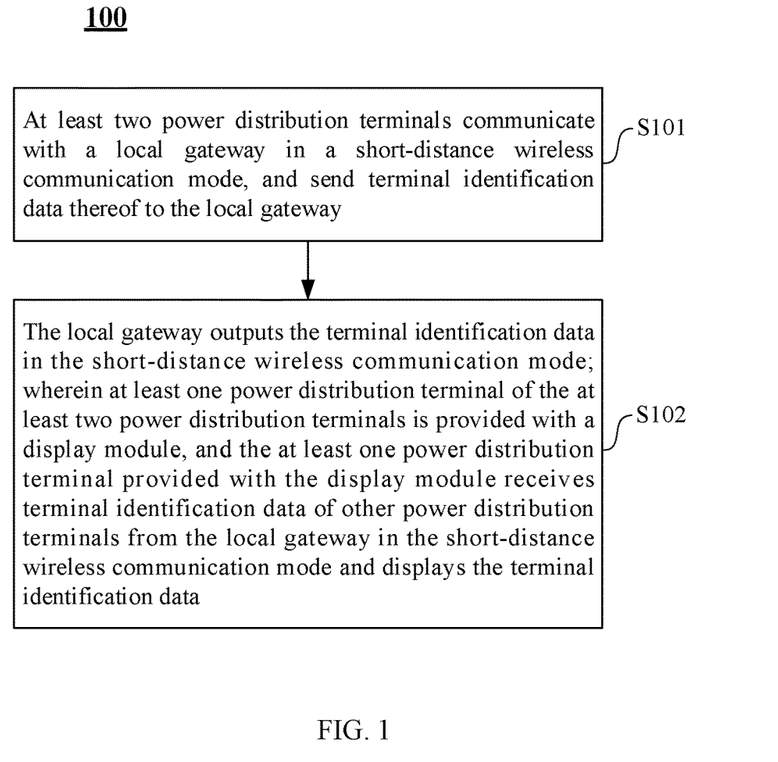
FIG. 1 illustrates an exemplary flowchart of a wireless power distribution display method 100 according to an embodiment of the present invention.

FIG. 1 illustrates an exemplary flowchart of a wireless power distribution display method 100 according to an embodiment of the present invention.

At first, in step S101, at least two power distribution terminals communicate with a local gateway in a short-distance wireless communication mode, and send terminal identification data thereof to the local gateway.

The short-distance wireless communication mode can be, for example, a short-distance wireless communication mode based on Zigbee protocol, or it can also be a Bluetooth communication mode. The embodiments of the present disclosure are not limited by the specific type of the selected short-distance wireless communication mode.

The power distribution terminal is intended to characterize the terminal equipment used for realizing the power distribution function, for example, it can be a power distribution control terminal used for controlling the power distribution process, or it can also be a power distribution detection terminal used for detecting the power distribution state. The embodiments of the present disclosure are not limited by the specific type of the power distribution terminal.

For example, the power distribution terminal can be connected to an external load. For example, if the power distribution terminal is a power distribution control terminal such as a contactor (iCT) or an impulse switch (iTL), it can be installed in an industrial distribution box or a household distribution box, with one end of its contact being connected to a power supply of the distribution box and the other end being connected to the external load; the external load can be an industrial field apparatus such as an electric motor or a sensor, or can be a household load circuit. For example, if the power distribution terminal is a detection terminal, it can be connected to a power distribution control circuit to be detected, or it can be connected to an electrical apparatus element to be detected. The embodiments of the present disclosure are not limited by the specific type of the power distribution terminal and the specific type of the external load connected to the power distribution terminal.

The terminal identification data of the power distribution terminal is intended to characterize the data used for identifying the power distribution terminal, so as to distinguish the power distribution terminal from other power distribution terminals in the current wireless power distribution display system. For example, it can be a terminal address code of the power distribution terminal, a model characteristic code of the power distribution terminal, or it can also be a code number identified by humans. For example, it can be a binary or quaternary digital code, or it can also be a character string or character code. The embodiments of the present disclosure are not limited by the specific content and form of the terminal identification data of the power distribution terminal.

Thereafter, in step S102, the local gateway outputs the terminal identification data in the short-distance wireless communication mode.

The local gateway is intended to characterize a communication gateway in a wireless power distribution display network. It is used for realizing a mutual communication between two power distribution terminals in the wireless power distribution network, and it can be, for example, a Zigbee gateway or other gateways used for realizing a short-distance wireless communication process. The embodiments of the present disclosure are not limited by the specific type of the local gateway.

At least one power distribution terminal of the at least two power distribution terminals is provided with a display module, and the at least one power distribution terminal provided with the display module receives terminal identification data of other power distribution terminals from the local gateway in the short-distance wireless communication mode and displays the terminal identification data.

Based on the above, in the wireless power distribution display method described in the present application, at least one of the power distribution terminals is provided with a display module, so that when on-site debugging is performed, users can check all the power distribution terminals in the current power distribution display system, through the display module of the power distribution terminal provided with the display module, which is convenient for on-site debugging and monitoring.

In some embodiments, at least one power distribution terminal provided with the display module receives at least one of terminal identification data, response information and response data of other power distribution terminals communicated with the local gateway from the local gateway in the short-distance wireless communication mode, uses the same as data to be displayed, and displays the data to be displayed.

The response information is intended to characterize the information sent to the power distribution terminal provided with the display module by other power distribution terminals. It can be, for example, working state information which characterizes the current working mode and state; or it can also be alarm information, such as abnormal report information that characterizes the current abnormality of the power distribution terminal. The embodiments of the present disclosure are not limited by the specific constitution and type of the response information.

The response data is intended to characterize the data sent to the power distribution terminal provided with the display module by other power distribution terminals in response to the received command information. It can be, for example, measurement data or internal parameter data of the terminal. For example, when the target power distribution terminal is a power distribution detection terminal, it returns the detection data of the current moment; or, it can also be execution feedback data. For example, when the target power distribution terminal is a power distribution control terminal and the command information is a specific control operation, it can, for example, return 1 if the target power distribution terminal performs the specific control operation well, or it can, for example, return 0 or other preset specific error codes if the target power distribution terminal fails to perform the control operation or has problems. The embodiments of the present disclosure are not limited by the specific constitution and type of the response data.

Based on the above, for example, only one of the power distribution terminals can be provided with the display module, or a plurality of power distribution terminals can be provided with the display module, depending on actual needs of users. The embodiments of the present disclosure are not limited by the number of the power distribution terminals provided with the display module among the power distribution terminals.

The display module is intended to characterize a functional module for displaying data. It can be, for example, a display screen or other display devices. The embodiments of the present disclosure are not limited by the specific constitution of the display module.

Based on the above, in the wireless power distribution display method described in the present application, at least one of the power distribution terminals is provided with a display module, so that it can receive the terminal identification data, response information or response data of each power distribution terminal in the wireless power distribution display system through a local gateway, and display the received information or data; in this way, when on-site debugging is performed, on the premise that the user can check all the power distribution terminals in the current power distribution display system through the power distribution terminal provided with the display module, the data or information of other power distribution terminals in the power distribution system can be further checked in real time through the power distribution terminal provided with the display module, which is convenient for on-site debugging and monitoring.

In some embodiments, the wireless power distribution control method further includes: at least one power distribution terminal provided with the display module receives a control command from a user, generates command information based on the control command, and sends the command information to the local gateway in the short-distance wireless communication mode. The command information includes the terminal identification data of a target power distribution terminal.

The control command may be a control command directly input by the user, such as a command directly typed in by the user, or it may be a control command generated by further processing the user's control command, such as a voltage or current signal generated based on the user's click when the user clicks on an area of the screen of the display module corresponding to a certain power distribution terminal. The embodiments of the present disclosure are not limited by the source of the control command.

The control command may be, for example, a data checking command, for example, a user specifies to check the detection data of a certain power distribution detection terminal; or it may be a power distribution control command, for example, a user instructs a certain power distribution control terminal to perform a corresponding disconnecting or closing operation to power on or power off the load circuit connected thereto. The embodiments of the present disclosure are not limited by the specific constitution and type of the control command.

The target power distribution terminal is intended to characterize a power distribution terminal that the current control command is intended to control. For example, it may be one power distribution terminal, or it may include a plurality of power distribution terminals. The embodiments of the present disclosure are not limited by the number of the target power distribution terminal(s).

The process of the power distribution terminal provided with the display module receiving the user's control command can be described more specifically. It can be realized by a wired manner such as Ethernet; and it can also be realized by a wireless manner, for example, by mobile communication systems such as the 3rd generation mobile communication system (3G) or the 4th generation mobile communication system (4G), or by general packet radio service technology (GPRS). The embodiments of the present disclosure are not limited by the specific manner through which the power distribution terminal provided with the display module receives the user's control command.

The command information may be, for example, character string information, or it may be preset numeric or alphabetic information. The embodiments of the present disclosure are not limited by the specific form of the command information.

The command information is intended to represent the user's control instruction, which includes the terminal identification data of the target power distribution terminal. For example, the command information can be obtained by looking up a command coding table based on the user's command to find corresponding command information, or it can be obtained based on other ways. The embodiments of the present disclosure are not limited by the generation mode of the command information.

Based on the above, the power distribution terminal provided with the display module can output a user's control command in real time by receiving the user's control command, generating command information based on the control command and sending the command information to the local gateway, which is convenient for the wireless power distribution display system to respond to the command, thus facilitating the realization of reliable control of power distribution.

In some embodiments, the local gateway will judge the received command information, for example, judging whether the terminal identification data of the target power distribution terminal contained in the command information corresponds to the current power distribution terminal in the wireless power distribution display system. If the terminal identification data of the target power distribution terminal does not correspond to any one of the power distribution terminals in the current system, the local gateway can judge the command information as error code information, for example, and send alarm information to the power distribution terminal provided with the display module.

Based on the above, the local gateway is configured to verify the command information, so that the error code information can be found in time and an alarm can be given, and an incorrect control of the power distribution terminal due to the wrong command information can be prevented, thereby improving the robustness of the wireless power distribution display system.

Figure 2:
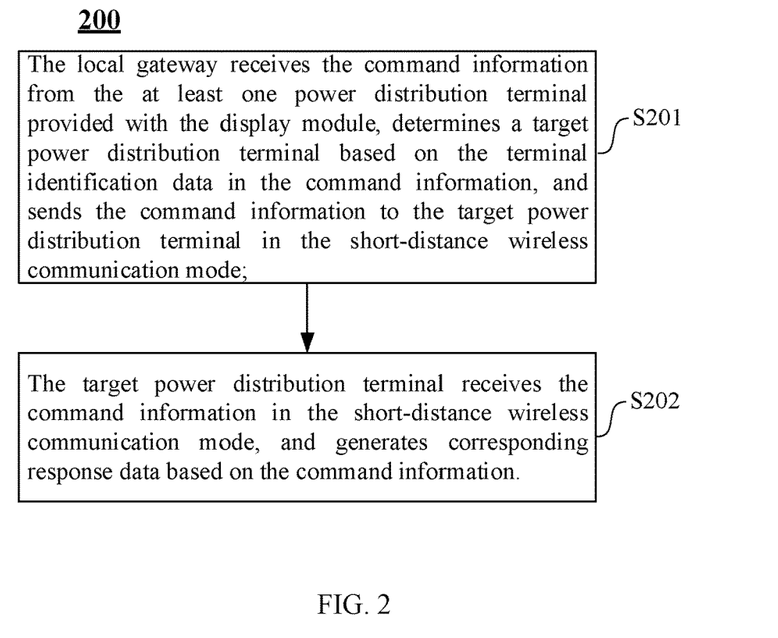
FIG. 2 illustrates an exemplary flowchart of a wireless power distribution display method 200 according to an embodiment of the present disclosure.

FIG. 2 illustrates an exemplary flowchart of a wireless power distribution display method 200 according to an embodiment of the present disclosure.

Referring to FIG. 2, in some embodiments, at first, in step S201, the local gateway receives the command information from the at least one power distribution terminal provided with the display module, determines a target power distribution terminal based on the terminal identification data in the command information, and sends the command information to the target power distribution terminal in the short-distance wireless communication mode.

For example, the process of determining the target power distribution terminal can be described in more details. For example, the local gateway can firstly analyze the command information, e.g., obtaining the terminal data of the target power distribution terminal contained in the command information, and then compare the terminal data with the terminal data of the target terminal stored in the current wireless power distribution display system to obtain the target terminal corresponding to the terminal data.

Thereafter, in step S202, the target power distribution terminal receives the command information in the short-distance wireless communication mode, and generates corresponding response data based on the command information.

The response data can be, for example, measurement data; for example, when the target power distribution terminal is a power distribution detection terminal, it returns the detection data of the current moment; or it can also be execution feedback data. For example, when the target power distribution terminal is a power distribution control terminal and the command information is a specific control operation, it can, for example, return 1 if the target power distribution terminal performs the specific control operation well; and it can, for example, return 0 or other preset specific error codes if the target power distribution terminal fails to perform the control operation or has problems. The embodiments of the present disclosure are not limited by the specific constitution and type of the response data.

For example, the process of generating corresponding response data based on the command information can be described in more details. For example, when the target power distribution terminal is a power distribution detection terminal and the control command is a data checking command, the power distribution detection terminal will detect the load connected to it based on the control command and generate a detection signal; and then the power distribution detection terminal will generate corresponding detection data based on the detection signal and output the detection data as the response data.

Based on the above, the local gateway determines the target power distribution terminal based on the command information and sends the command information to the target power distribution terminal, so that the target power distribution terminal can generate corresponding response data based on the command information and send the response data. In this way, the control command of the user at the power distribution terminal provided with the display module can achieve a real-time and efficient response, and the efficiency and stability of the wireless power distribution display system are improved.

Figure 3:
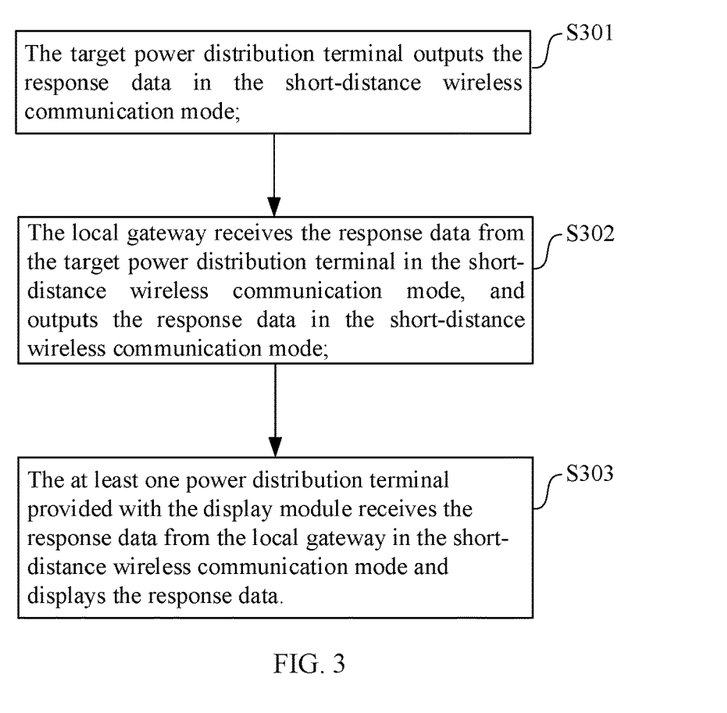
FIG. 3 illustrates an exemplary flowchart of a wireless power distribution display method 300 according to an embodiment of the present disclosure.

FIG. 3 illustrates an exemplary flowchart of a wireless power distribution display method 300 according to an embodiment of the present disclosure.

Referring to FIG. 3, in some embodiments, at first, in step S301, the target power distribution terminal outputs the response data in the short-distance wireless communication mode.

Thereafter, in step S302, the local gateway receives the response data from the target power distribution terminal in the short-distance wireless communication mode, and outputs the response data in the short-distance wireless communication mode.

After being forwarded by the local gateway, in step S303, the at least one power distribution terminal provided with the display module receives the response data from the local gateway in the short-distance wireless communication mode and displays the response data.

For example, the power distribution terminal provided with the display module may display the response data in a data area on the screen corresponding to the power distribution terminal, or may display the response data in the form of a pop-up window. The embodiments of the present disclosure are not limited by the specific way through which the power distribution terminal provided with the display module displays the response data.

Based on the above, the response data is sent from the target power distribution terminal to the wireless gateway, forwarded by the wireless gateway, and finally received by the power distribution terminal provided with the display module; and the power distribution terminal provided with the display module will further display the response data. In this way, it can be beneficial for users to check the data of other power distribution terminals in real time, especially in the process of on-site debugging, and can reflect the current data or working state of the target power distribution terminal in real time, thus realizing efficient control of power distribution.

Figure 4:
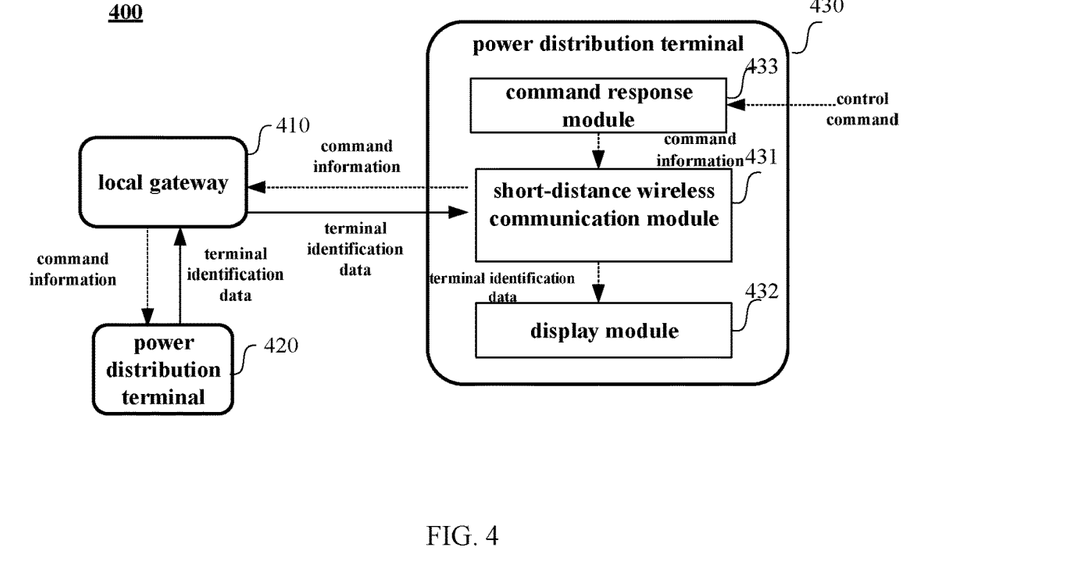
FIG. 4 illustrates an exemplary block diagram of a wireless power distribution display system 400 according to an embodiment of the present disclosure.

According to another aspect of the present disclosure, a wireless power distribution display system is provided. FIG. 4 illustrates an exemplary block diagram of a wireless power distribution display system 400 according to an embodiment of the present disclosure.

Referring to FIG. 4, the wireless power distribution display system includes a local gateway 410 and at least one power distribution terminal. Power distribution terminals 420 and 430 are illustrated in FIG. 4.

The local gateway can be, for example, a coordinator gateway in Zigbee communication, which is used for forwarding communication information between various power distribution terminals so as to realize the communication between the power distribution terminals, or the local gateway can be other types of gateways, and the embodiments of the present disclosure are not limited by the type of the local gateway.

The power distribution terminal is intended to characterize the terminal equipment used for realizing the power distribution function, for example, it can be a power distribution control terminal used for controlling the power distribution process, or it can also be a power distribution detection terminal used for detecting the power distribution state. The embodiments of the present disclosure are not limited by the specific type of the power distribution terminal.

At least one of the at least one power distribution terminal is provided with a display module. The power distribution terminal 430 illustrated in FIG. 4 has a display module.

The display module is intended to characterize a functional module for displaying data, which can be, for example, a display screen or other display devices. The embodiments of the present disclosure are not limited by the specific constitution of the display module.

For example, only one of the power distribution terminals can be provided with the display module, or a plurality of power distribution terminals can be provided with the display module, depending on actual needs of users. The embodiments of the present disclosure are not limited by the number of the power distribution terminals provided with the display module among the power distribution terminals.

Furthermore, the local gateway outputs the terminal identification data in a short-distance wireless communication mode; and the at least one power distribution terminal provided with a display module receives the terminal identification data of other power distribution terminals from the local gateway in a short-distance wireless communication mode, and displays the terminal identification data.

The short-distance wireless communication mode can be, for example, a short-distance wireless communication mode based on Zigbee protocol, or it can also be a Bluetooth communication mode. The embodiments of the present disclosure are not limited by the specific type of the selected short-distance wireless communication mode.

The terminal identification data of the power distribution terminal is intended to characterize the data used for identifying the power distribution terminal, so as to distinguish the power distribution terminal from other power distribution terminals in the current wireless power distribution display system. The embodiments of the present disclosure are not limited by the specific content and form of the terminal identification data of the power distribution terminal.

Based on the above, in the wireless power distribution display system described in the present application, at least one of the power distribution terminals is provided with a display module, and it can receive and display the terminal identification data of each power distribution terminal in the wireless power distribution display system through the local gateway, so that when on-site debugging is performed, users can check all the power distribution terminals in the current wireless power distribution display system through the display module of the power distribution terminal provided with the display module, which is convenient for users to check the data of other power distribution terminals in the power distribution system in real time through the power distribution terminal, and is convenient for on-site debugging and monitoring.

In some embodiments, referring to FIG. 4, the at least one power distribution terminal 430 provided with a display module includes a short-distance wireless communication module 431 and a display module 432.

The short-distance wireless communication module 431 is configured to receive at least one of terminal identification data, response information and response data of other power distribution terminals communicated with the local gateway from the local gateway in a short-distance wireless communication mode, and to use it as data to be displayed.

The display module 432 is configured to be connected with the short-distance wireless communication module, receive the data to be displayed from the short-distance wireless communication module, and display the data to be displayed.

Based on the above, the at least one power distribution terminal provided with a display module receives at least one of terminal identification data, response information and response data from other power distribution terminals of the local gateway through its short-distance wireless communication module, and uses the same as the data to be displayed, and further displays the data to be displayed through the display module, so that it can acquire and display the terminal identification data of other power distribution terminals in a real-time and efficient manner, which is beneficial to the subsequent acquisition of data and information of each power distribution terminal in the wireless power distribution display system based on the user's operation instruction and is beneficial to the realization of controlling the power distribution terminals.

In some embodiments, the at least one power distribution terminal provided with a display module further includes a command response module 433, and the command response module 433 is configured to receive a user's control command, generate command information based on the control command, and send the command information to a local gateway in a short-distance wireless communication mode. The command information includes the terminal identification data of a target power distribution terminal.

The control command may be a control command directly input by the user, or may be a control command generated by further processing the user's control command. The embodiments of the present disclosure are not limited by the source of the control command.

The control command may be, for example, a data checking command, or may also be a power distribution control command. The embodiments of the present disclosure are not limited by the specific constitution and type of the control command.

The target power distribution terminal is intended to characterize the power distribution terminal that the current control command is intended to control. For example, it can be one power distribution terminal, or it can include a plurality of power distribution terminals. The embodiments of the present disclosure are not limited by the number of the target power distribution terminal(s).

The process of the power distribution terminal provided with the display module receiving the user's control command can be described more specifically. It can be realized by a wired manner such as Ethernet; and it may also be realized by a wireless manner. The embodiments of the present disclosure are not limited by the specific manner through which the power distribution terminal provided with the display module receives the user's control command.

The command information may be, for example, character string information, or may be preset numeric or alphabetic information. The embodiments of the present disclosure are not limited by the specific form of the command information.

The command information is intended to represent the user's control instruction, which includes the terminal identification data of the target power distribution terminal. For example, the command information can be obtained by looking up a command coding table based on the user's command, or it can be obtained based on other ways. The embodiments of the present disclosure are not limited by the generation mode of the command information.

Based on the above, the power distribution terminal provided with the display module receives the user's control command through the command response module, generates command information based on the control command, and sends the command information to the local gateway, so that the user's control command can be output to the outside in real time, which is convenient for the wireless power distribution display system to respond to the command, thus facilitating the realization of reliable control of power distribution.

In some embodiments, the local gateway receives the command information from the at least one power distribution terminal provided with the display module, determines a target power distribution terminal based on the terminal identification data in the command information, and sends the command information to the target power distribution terminal in a short-distance wireless communication mode.

The process of determining the target power distribution terminal by the local gateway can include, for example, analyzing the command information, and comparing the terminal data of the target power distribution terminal in the command information with the terminal data of the target terminal stored in the current wireless power distribution display system to obtain the target terminal corresponding to the terminal data; or, the target power distribution terminal can also be determined by other ways. The embodiments of the present disclosure are not limited by the specific way of determining the target power distribution terminal.

Furthermore, the target power distribution terminal receives the command information in a short-distance wireless communication mode, and generates corresponding response data based on the command information.

For example, the process of generating corresponding response data based on the command information can be described in more details. For example, when the target power distribution terminal is a power distribution detection terminal and the control command is a data checking command, the power distribution detection terminal will detect the load connected to it based on the control command and generate a detection signal, and then the power distribution detection terminal will generate corresponding detection data based on the detection signal and output the detection data as the response data.

Based on the above, the local gateway determines the target power distribution terminal based on the command information, and sends the command information to the target power distribution terminal, so that the target power distribution terminal can generate corresponding response data based on the command information and send the response data, thus realizing real-time and efficient response to the control command of the user at the power distribution terminal provided with the display module, and improving the efficiency and stability of the wireless power distribution display system.

Figure 5:
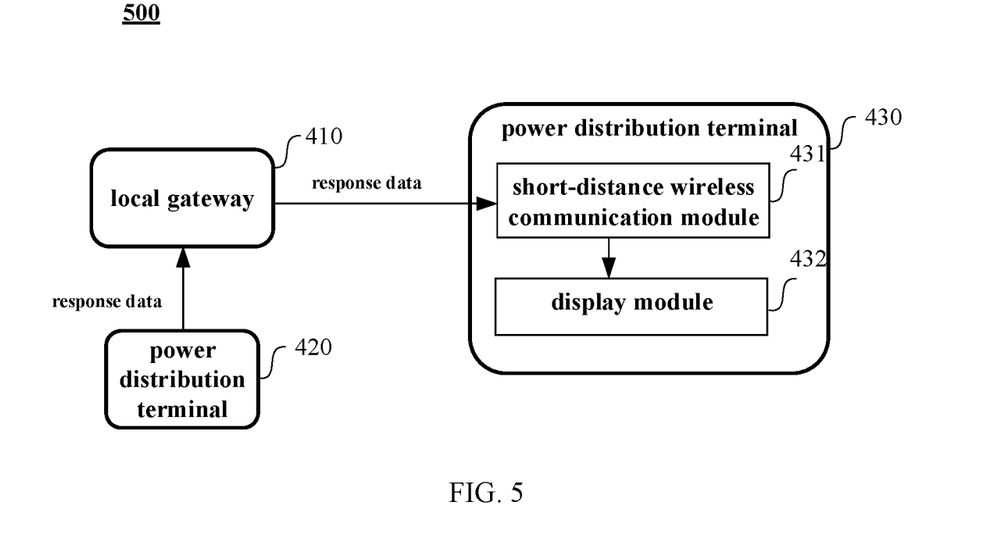
FIG. 5 illustrates an exemplary block diagram of a process of displaying response data by a power distribution terminal provided with a display module in a wireless power distribution display system 400 according to an embodiment of the present disclosure.

FIG. 5 illustrates an exemplary block diagram of a process of displaying response data by a power distribution terminal provided with a display module in a wireless power distribution display system 400 according to an embodiment of the present disclosure.

Referring to FIG. 5, in some embodiments, the target power distribution terminal outputs the response data in a short-distance wireless communication mode. The local gateway receives the response data from the target power distribution terminal in a short-distance wireless communication mode, and outputs the response data in a short-distance wireless communication mode. The at least one power distribution terminal provided with the display module receives the response data from the local gateway in a short-distance wireless communication mode, and displays the response data.

The response data may be, for example, detection data or execution feedback data. It may be, for example, voltage or current data, or may be binary code data. The embodiments of the present disclosure are not limited by the specific constitution and type of the response data.

For example, the power distribution terminal provided with the display module can display the response data in a data area on the screen corresponding to the power distribution terminal, or it can also display the response data in the form of a pop-up window. The embodiments of the present disclosure are not limited by the specific way through which the power distribution terminal provided with the display module displays the response data.

Based on the above, the response data is sent from the target power distribution terminal to the wireless gateway, forwarded by the wireless gateway, and finally received by the power distribution terminal provided with the display device; and the power distribution terminal provided with the display device will further display the response data. Therefore, it can be beneficial for users to check the data of other power distribution terminals in real time, especially in the process of on-site debugging, and can reflect the current data or working state of the target power distribution terminal in real time, thus realizing efficient control of power distribution.

Figure 6A:
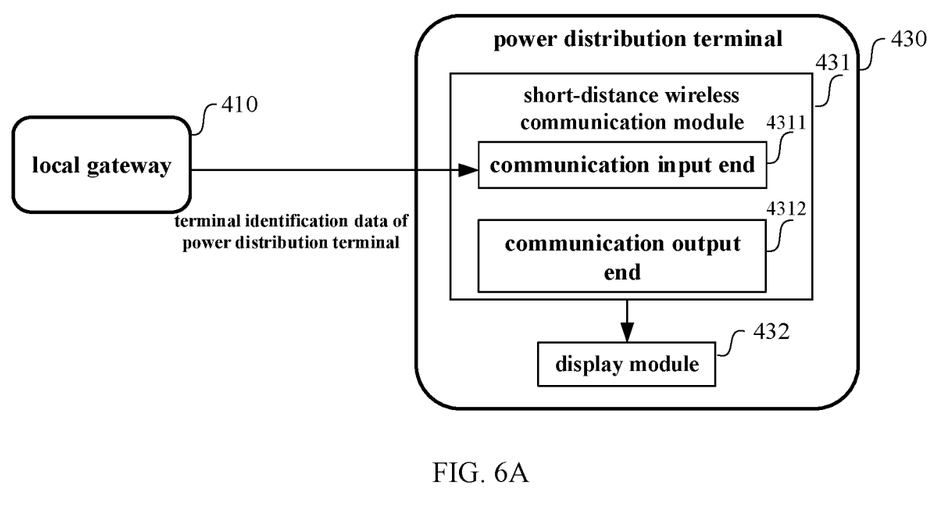
FIG. 6A illustrates an exemplary block diagram of a power distribution terminal 430 provided with a display module according to an embodiment of the present disclosure.

According to yet another aspect of the present disclosure, it also provides a power distribution terminal provided with a display module. FIG. 6A illustrates an exemplary block diagram of a power distribution terminal 430 provided with a display module according to an embodiment of the present disclosure.

Referring to FIG. 6A, as described above, the power distribution terminal 430 provided with a display module includes a short-distance wireless communication module 431 and a display module 432.

The short-distance wireless communication module 431 includes a communication input end 4311 and a communication output end 4312; and the communication input end 4312 receives at least one of terminal identification data, response information and response data of other power distribution terminals communicated with the local gateway 410 from the local gateway 410 in a short-distance wireless communication mode, and uses the same as data to be displayed.

The display module 432 is connected with the short-distance wireless communication module 431, receives the data to be displayed from the short-distance wireless communication module 431, and displays the data to be displayed.

The terminal identification data of the power distribution terminal is intended to characterize the data used for identifying the power distribution terminal, so as to distinguish the power distribution terminal from other power distribution terminals in the current wireless power distribution display system. The response information is intended to characterize the information sent to the power distribution terminal provided with the display module from other power distribution terminals, and may include, for example, working status information or alarm information. The response data is intended to characterize the data sent to the power distribution terminal provided with the display module by other power distribution terminals in response to the received command information, and may be, for example, detection data or internal parameter data of the terminal, or control feedback data. The embodiments of the present disclosure are not limited by the specific types and contents of the terminal identification data, response information and response data.

The display module is intended to display data or information, and it can be, for example, a display screen, such as an LCD screen, a touch screen, or other types of display modules. The embodiments of the present disclosure are not limited by the specific type and constitution of the display module.

Based on the power distribution terminal provided with the display module proposed in the present application, the power distribution terminal can acquire and display the power distribution identification data of other power distribution terminals in the wireless power distribution display system, so that users can check and control the terminal data of other power distribution terminals in the power distribution display system through convenient operation, thus realizing the display of multiple terminals by a single screen. In this way, it is beneficial for improving the response speed of the wireless power distribution display system to user commands, and beneficial for acquiring relevant data of other power distribution terminals in real time during on-site debugging.

Figure 6B:
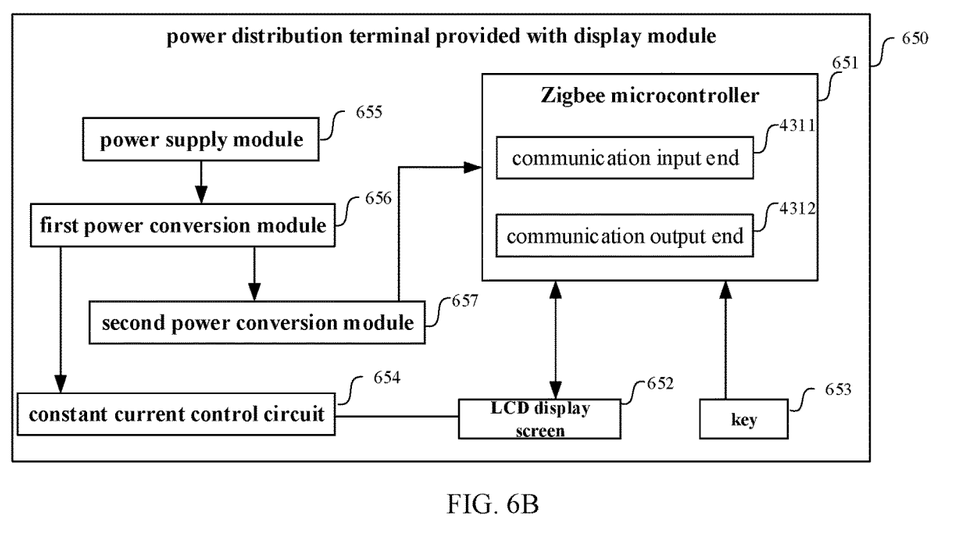
FIG. 6B illustrates a schematic diagram of a variant 650 of a power distribution terminal provided with a display module according to an embodiment of the present disclosure.

FIG. 6B illustrates a schematic diagram of a variant 650 of a power distribution terminal provided with a display module according to an embodiment of the present disclosure.

Referring to FIG. 6B, in some embodiments, the short-distance wireless communication mode is, for example, a Zigbee communication mode, and the short-distance wireless communication module can be, for example, a Zigbee microcontroller 651. The display module is, for example, a display screen 652, and the display module is also provided with a corresponding key 653 for the user to operate or select.

In some embodiments, the power distribution terminal 650 provided with a display module further includes a constant current control circuit 654, which is used for controlling the display module, for example, controlling the display brightness, the position of the display area, and related functions of the display module. The embodiments of the present disclosure are not limited by the specific constitution of the constant current control circuit.

In some embodiments, the power distribution terminal 650 provided with a display module further includes a power supply module 655, which is used for supplying power to the Zigbee microcontroller 651 and the display screen 652. The power supply module is, for example, a constant current power supply, or it can also be an alternating current power supply. The embodiments of the present disclosure are not limited by the specific type of the power output by the power supply module.

Further, in order to well satisfy the power supply requirements, a first power conversion module 656 and a second power conversion module 657 can also be provided.

The first power conversion module 656 is used for converting the alternating current (for example, 230V alternating current) output by the power supply module into direct current and outputting a first power voltage, for supplying power to the constant current control circuit 654. The first power supply voltage is, for example, 24V DC voltage or 36V DC voltage. The embodiments of the present disclosure are not limited by the specific value of the output voltage of the first power conversion module.

The second power conversion module 657 is used for converting the first power supply voltage into a second power supply voltage and output the second power supply voltage, so as to supply power to the Zigbee microcontroller 651. Furthermore, the second power supply voltage can be, for example, 3.3V DC, or it can be set according to actual requirements. The embodiments of the present disclosure are not limited by the specific value of the output voltage of the second power conversion module.

Figure 6C:
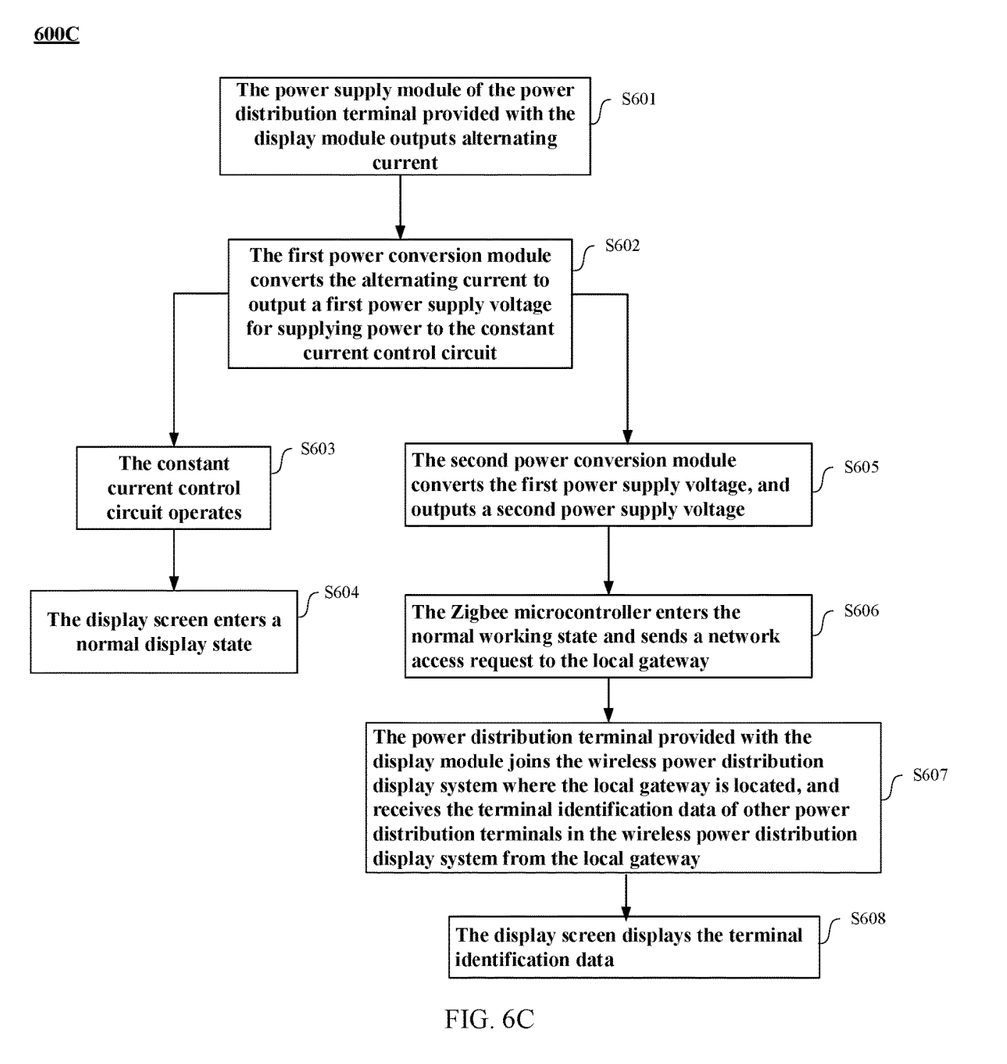
FIG. 6C illustrates an exemplary flowchart of the power distribution terminal 650 provided with a display module as illustrated in FIG. 6B.

For example, the working process of the power distribution terminal provided with the display module as illustrated in FIG. 6B can be described in more details. FIG. 6C illustrates an exemplary flowchart of the power distribution terminal 650 provided with a display module as illustrated in FIG. 6B.

Referring to FIG. 6C, at first, in step S601, the power supply module 655 of the power distribution terminal 650 provided with the display module outputs alternating current. Thereafter, in step S602, the alternating current is converted via the first power conversion module 656 to output a first power supply voltage, which is used for supplying power to the constant current control circuit 654. Thereafter, in step S603, the constant current control circuit 654 operates to control the display screen 652. Further, in step S604, the display screen 652 enters a normal display state.

Moreover, based on FIG. 6C, in step S605, the second power conversion module 657 converts the first power supply voltage, and outputs a second power supply voltage which is used for supplying power to the Zigbee microcontroller. Thereafter, in step S606, the Zigbee microcontroller enters the normal working state and sends a network access request to the local gateway. Thereafter, in step S607, the power distribution terminal provided with the display module joins the wireless power distribution display system where the local gateway is located, and receives the terminal identification data of other power distribution terminals in the wireless power distribution display system from the local gateway. Based on the terminal identification data, in step S608, the display screen 652 displays the terminal identification data.

It should be understood that, step S603 and step S605 may be performed sequentially or simultaneously. The embodiments of the present disclosure are not limited by the sequence of these steps.

In some embodiments, the display module is further configured to receive a control command from a user and generate a command signal based on the control command.

The process of the display module receiving the user instruction can be performed, for example, by a user-based keys operation, e.g., by the user pressing down a key for checking the data; or it can also be performed by the user clicking on a location of a specific area of the display module, for example, the display module is a touch screen and the user clicks on a display area corresponding to a certain user terminal; or it can also receive the user's control command in other ways. The embodiments of the present disclosure are not limited by the specific way through which the display module receives the user command.

Furthermore, the short-distance wireless communication module receives the command signal from the display module, generates command information based on the command signal, and the communication output end of the short-distance wireless communication module sends the command information to the local gateway in a short-distance wireless communication mode. The command information includes the terminal identification data of a target power distribution terminal.

Based on the above, the power distribution terminal provided with the display module receives the user's control command through the command response module, generates command information based on the control command, and sends the command information to the local gateway, so that the user's control command can be output to the outside in real time, which is convenient for the wireless power distribution display system to respond to the command, thus facilitating the realization of reliable control of power distribution.

In some embodiments, the communication input end of the short-distance wireless communication module receives the response data from the local gateway in a short-distance wireless communication mode; the display module receives the response data from the short-distance wireless communication module and displays the response data.

Based on the above, the power distribution terminal provided with the display device receives the response data from other power distribution terminals and further displays the response data, which can be beneficial for users to check the data of other power distribution terminals in real time, especially in the process of on-site debugging, and can reflect the current data or working state of the target power distribution terminal in real time, thus realizing efficient control of power distribution.

Figure 7A:
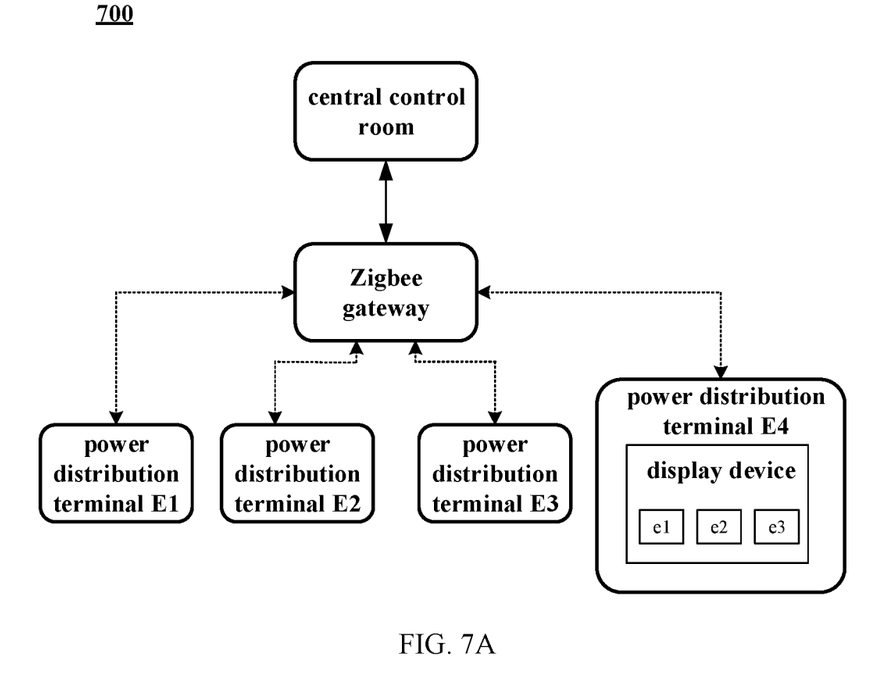
FIG. 7A illustrates a schematic diagram of a wireless power distribution display system 700 according to an embodiment of the present disclosure.

Thereafter, the workflow of the wireless power distribution terminal provided with the display module in the wireless power distribution display system will be explained in details in combination with the aforementioned wireless power distribution display system. FIG. 7A illustrates a schematic diagram of a wireless power distribution display system 700 according to an embodiment of the present disclosure, and FIG. 7B illustrates an exemplary flowchart of a power distribution terminal provided with a display module which is operating in a wireless power distribution display system 700 according to an embodiment of the present disclosure.

Figure 7B:
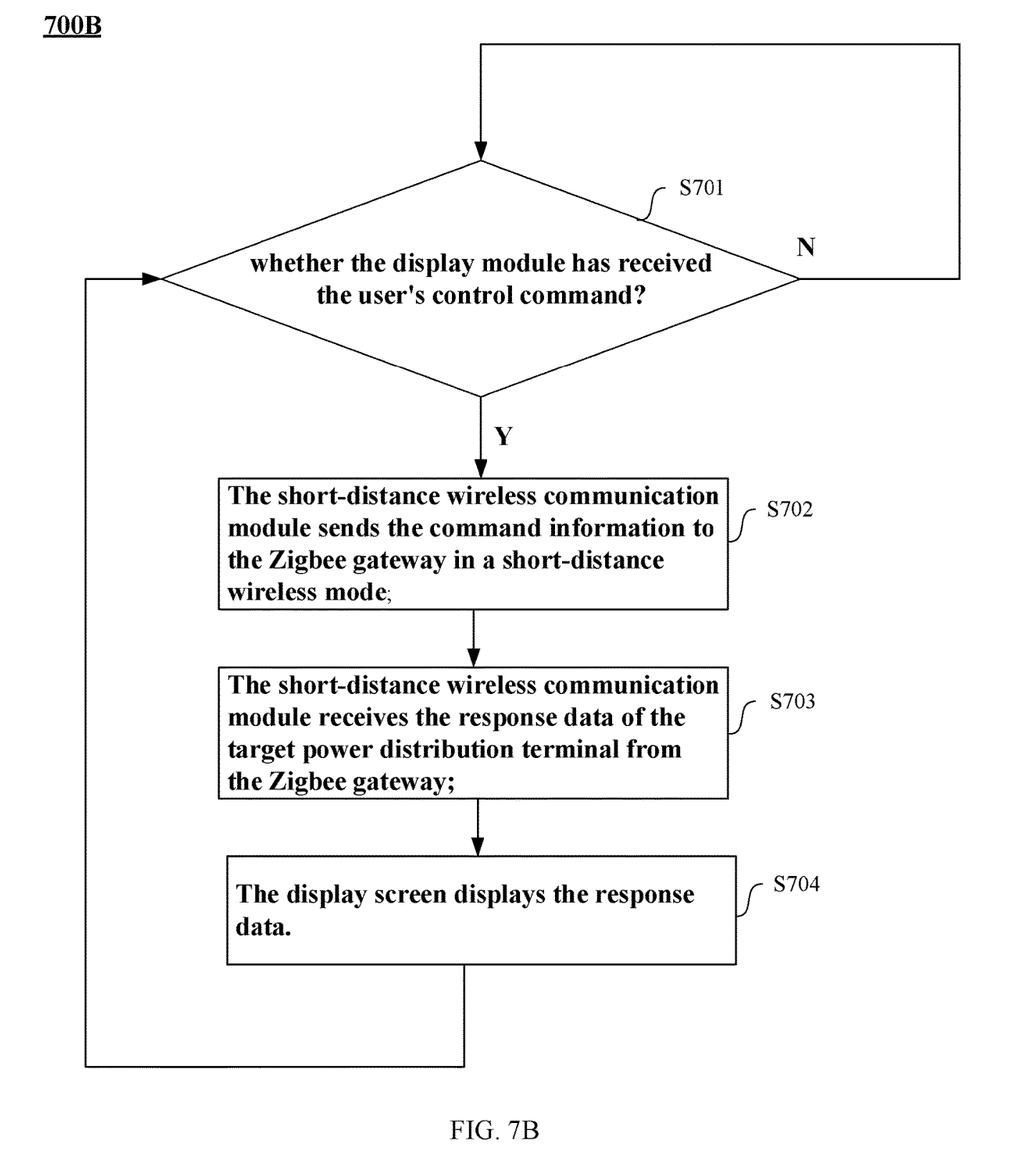
FIG. 7B illustrates an exemplary flowchart of a power distribution terminal provided with a display module which is operating in a wireless power distribution display system 700 according to an embodiment of the present disclosure.

Referring to FIGS. 7A and 7B, the wireless power distribution display system 700 includes, for example, a central control room, a Zigbee gateway, and power distribution terminals E1, E2, E3, and E4. The power distribution terminal E4 is the power distribution terminal provided with a display module, and further includes a short-distance wireless communication module (not shown in FIG. 7A) based on the above. Furthermore, the Zigbee gateway is used for realizing mutual communication between two power distribution terminals of the plurality of power distribution terminals. The display module is, for example, a touch screen, and the central control room can, for example, receive data of each power distribution terminal from the Zigbee gateway.

Based on this, first of all, as mentioned above, the power distribution terminal E4 provided with a display module sends a network access request to the Zigbee gateway, for example, to join the current wireless power distribution display system, receives the terminal identification data of other distribution terminals E1, E2, E3 from the Zigbee gateway, and displays the terminal identification data on the touch screen. For example, the terminal identification data of the power distribution terminals E1, E2, E3 are e1, e2, e3, respectively. Thereafter, the power distribution terminal E4 provided with a display module may, for example, execute the process 700B as illustrated in FIG. 7B.

First of all, in step S701, the power distribution terminal E4 provided with a display module judges whether its display module has received the user's control command, and if not, continuing with the process. When the user's control command is found, the power distribution terminal E4 will generate command information based on the control command; and further, in step S702, the command information will be sent to the Zigbee gateway via the short-distance wireless communication module in a short-distance wireless mode. As mentioned above, the command information includes the terminal identification data of the target power distribution terminal. Thereafter, in step S703, the short-distance wireless communication module will receive the response data of the target power distribution terminal from the Zigbee gateway; and further, in step S705, the response data will be displayed on the display module.

For example, when the power distribution terminal E1 is a power distribution detection terminal and the power distribution terminal E2 is a power distribution control terminal, if the user's control instruction is "Query the detection data of the power distribution terminal E1", the power distribution terminal E4 provided with a display module generates command information "task 1, e1" based on the control instruction, for example, where task1 represents the task of querying the detection data and e1 is the terminal identification data of the current target power distribution terminal E1. Then through the forwarding of the Zigbee gateway, the target power distribution terminal E1 can generate corresponding response data based on the control command, for example, the response data is currently detected voltage value data, which is "46V". Then, through the forwarding of the Zigbee gateway, the power distribution terminal provided with a display module can receive the data, for example, and display the data, i.e., "46V", on its display module, i.e., the display screen.

The present application uses specific words to describe the embodiments thereof. The words such as "the first/second embodiment", "one embodiment" and/or "some embodiments" are intended to indicate a certain feature, structure or characteristic related to at least one embodiment of the present application. Therefore, it should be emphasized and noted that, "an embodiment" or "one embodiment" or "an alternative embodiment" mentioned twice or more in different places of the present specification does not necessarily indicate the same embodiment. In addition, some features, structures or features in one or more embodiments of the present application may be combined appropriately.

Unless otherwise defined, all the terms (including technical and scientific terms) used here have the same meanings as those commonly understood by those of ordinary skill in the field to which this invention belongs. It should also be understood that terms such as those defined in common dictionaries should be interpreted as having meanings consistent with their meanings in the context of the related art, and should not be interpreted in idealized or extremely formal meanings, unless explicitly defined as such here.

The above are explanations of the present invention, but should not be considered as a limitation thereto. Although several exemplary embodiments of the present disclosure have been described, those skilled in the art will easily understand that many modifications can be made to the exemplary embodiments without departing from the novel teachings and advantages of the present disclosure. Therefore, all these modifications are intended to be included in the scope of the present invention as defined in the claims. It should be understood that the above are explanations of the present invention, and should not be considered as any limitation to the specific embodiments as disclosed, and modifications to the disclosed embodiments and other embodiments are intended to be included in the scope of the appended claims. The present invention is defined by the claims and their equivalents.

What is claimed is:

1. A wireless power distribution display system, comprising:
a local gateway; and
at least two power distribution terminals, which are configured to communicate with the local gateway in a short-distance wireless communication mode and sending terminal identification data thereof to the local gateway, the power distribution terminal is intended to characterize the terminal equipment used for realizing the power distribution function;
wherein at least one power distribution terminal of the at least two power distribution terminals is provided with a display module; and
wherein the local gateway is configured to outputs the terminal identification data in the short-distance wireless communication mode, and the at least one power distribution terminal provided with the display module is configured to receives the terminal identification data of other power distribution terminals from the local gateway in the short-distance wireless communication mode and displays the terminal identification data;
wherein the at least one power distribution terminal provided with the display module comprises:
a short-distance wireless communication module, which is configured to receive at least one selected from the group consisted of the terminal identification data, response information and response data of other power distribution terminals communicated with the local gateway from the local gateway in the short-distance wireless communication mode, and use the same as data to be displayed;
wherein the terminal identification data of the power distribution terminal is intended to characterize the data used for identifying the power distribution terminal, so as to distinguish the power distribution terminal from other power distribution terminals in the current wireless power distribution display system; the response information is intended to characterize the information sent to the power distribution terminal provided with the display module from other power distribution terminals, and includes one of working status information and alarm information; and the response data is intended to characterize the data sent to the power distribution terminal provided with the display module by other power distribution terminals in response to the received command information, and includes one of a group consisting of detection data, internal parameter data of the terminal, and control feedback data;
the display module, which is configured to connect with the short-distance wireless communication module, receive the data to be displayed from the short-distance wireless communication module and display the data to be displayed.

2. The wireless power distribution display system according to claim 1, wherein,
the at least one power distribution terminal provided with the display module is configured to receives a user's control command, generates command information based on the control command, and sends the command information to the local gateway in the short-distance wireless communication mode;
wherein the command information comprises the terminal identification data of a target power distribution terminal.

3. The wireless power distribution display system according to claim 2, wherein,
the local gateway is configured to receives the command information from the at least one power distribution terminal provided with the display module, determines the target power distribution terminal based on the terminal identification data in the command information, and sends the command information to the target power distribution terminal in the short-distance wireless communication mode; and
the target power distribution terminal is configured to receives the command information in the short-distance wireless communication mode, and generates corresponding response data based on the command information.

4. The wireless power distribution display system according to claim 3, wherein,
the target power distribution terminal is configured to outputs the response data in the short-distance wireless communication mode;
the local gateway is configured to receives the response data from the target power distribution terminal in the short-distance wireless communication mode, and outputs the response data in the short-distance wireless communication mode; and
the at least one power distribution terminal provided with the display module is configured to receives the response data from the local gateway in the short-distance wireless communication mode and displays the response data.

5. A power distribution terminal provided with a display module, which is intended to characterize the terminal equipment used for realizing the power distribution function, comprising:
a short-distance wireless communication module, the short-distance wireless communication module comprising a communication input end and a communication output end, wherein the communication input end is configured to receive at least one selected from the group consisted of terminal identification data, response information and response data of other power distribution terminals communicated with the local gateway from the local gateway in a short-distance wireless communication mode, and use the same as data to be displayed; and
the display module, which is configured to connected to the short-distance wireless communication module, receive the data to be displayed from the short-distance wireless communication module and display the data to be displayed;
wherein the terminal identification data of the power distribution terminal is intended to characterize the data used for identifying the power distribution terminal, so as to distinguish the power distribution terminal from other power distribution terminals in the current wireless power distribution display system; the response information is intended to characterize the information sent to the power distribution terminal provided with the display module from other power distribution terminals, and includes one of working status information and alarm information; and the response data is intended to characterize the data sent to the power distribution terminal provided with the display module by other power distribution terminals in response to the received command information, and includes one of a group consisting of detection data, internal parameter data of the terminal, and control feedback data.

6. The power distribution terminal provided with the display module according to claim 5, wherein,
the display module is configured to receives a control command from a user and generates a command signal based on the control command;
the short-distance wireless communication module is configured to receives the command signal from the display module and generates command information based on the command signal; and
the communication output end of the short-distance wireless communication module is configured to sends the command information to the local gateway in the short-distance wireless communication mode;
wherein the command information comprises the terminal identification data of a target power distribution terminal.

7. The power distribution terminal provided with the display module according to claim 5, wherein,
the communication input end of the short-distance wireless communication module is configured to receives the response data from the local gateway in the short-distance wireless communication mode; and
the display module is configured to receives the response data from the short-distance wireless communication module and displays the response data.

8. A wireless power distribution display method, comprising:
communicating with a local gateway in a short-distance wireless communication mode, and sending terminal identification data thereof to the local gateway, by at least two power distribution terminals; wherein the power distribution terminal is intended to characterize the terminal equipment used for realizing the power distribution function; and
outputting the terminal identification data in the short-distance wireless communication mode, by the local gateway;
wherein at least one power distribution terminal of the at least two power distribution terminals is provided with a display module, and
wherein the at least one power distribution terminal provided with the display module receives the terminal identification data of other power distribution terminals from the local gateway in the short-distance wireless communication mode, and displays the terminal identification data;
receiving at least one selected from the group consisted of terminal identification data, response information and response data of other power distribution terminals communicated with the local gateway from the local gateway in the short-distance wireless communication mode, using the same as data to be displayed, and displaying the data to be displayed, by the at least one power distribution terminal provided with the display module;
wherein the terminal identification data of the power distribution terminal is intended to characterize the data used for identifying the power distribution terminal, so as to distinguish the power distribution terminal from other power distribution terminals in the current wireless power distribution display system; the response information is intended to characterize the information sent to the power distribution terminal provided with the display module from other power distribution terminals, and includes one of working status information and alarm information; and the response data is intended to characterize the data sent to the power distribution terminal provided with the display module by other power distribution terminals in response to the received command information, and includes one of a group consisting of detection data, internal parameter data of the terminal, and control feedback data.

9. The wireless power distribution display method according to claim 8, further comprising:
receiving a user's control command, generating command information based on the control command, and sending the command information to the local gateway in the short-distance wireless communication mode, by the at least one power distribution terminal provided with the display module;
wherein the command information comprises the terminal identification data of a target power distribution terminal.

10. The wireless power distribution display method according to claim 9, further comprising:
receiving the command information from the at least one power distribution terminal provided with the display module, determining the target power distribution terminal based on the terminal identification data in the command information, and sending the command information to the target power distribution terminal in the short-distance wireless communication mode, by the local gateway; and
receiving the command information in the short-distance wireless communication mode, and generating corresponding response data based on the command information, by the target power distribution terminal.

11. The wireless power distribution display method according to claim 10, further comprising:
outputting the response data in the short-distance wireless communication mode by the target power distribution terminal;
receiving the response data from the target power distribution terminal in the short-distance wireless communication mode, and outputting the response data in the short-distance wireless communication mode, by the local gateway; and
receiving the response data from the local gateway in the short-distance wireless communication mode and displaying the response date, by the at least one power distribution terminal provided with the display module.

\* \* \* \* \*